United States Patent
Lee (10) Patent No.: US 8,804,433 B2
(45) Date of Patent: Aug. 12, 2014

(54) SEMICONDUCTOR MEMORY DEVICE AND OPERATING METHOD THEREOF

(75) Inventor: Hyung Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 228 days.

(21) Appl. No.: 13/531,998

(22) Filed: Jun. 25, 2012

(65) Prior Publication Data

US 2012/0327718 A1    Dec. 27, 2012

(30) Foreign Application Priority Data

Jun. 27, 2011    (KR) .................. 10-2011-0062183

(51) Int. Cl.
*G11C 16/10*    (2006.01)

(52) U.S. Cl.
USPC .................................. 365/185.22; 365/185.2

(58) Field of Classification Search
None
See application file for complete search history.

(56) References Cited

U.S. PATENT DOCUMENTS

2012/0134214 A1 *    5/2012    Joo .................. 365/185.19

FOREIGN PATENT DOCUMENTS

| KR | 1020100106761 | 10/2010 |
|---|---|---|
| KR | 101145463 | 5/2012 |
| KR | 1020120059035 | 6/2012 |

OTHER PUBLICATIONS

Notice of Allowance issued by the Korean Intellectual Property Office on Feb. 27, 2013.

* cited by examiner

*Primary Examiner* — Hoai V Ho
*Assistant Examiner* — James G Norman
(74) *Attorney, Agent, or Firm* — IP & T Group LLP (57) ABSTRACT

An operating method of a semiconductor memory device includes performing a first LSB program loop for storing first LSB data in first memory cells of a word line, performing a second LSB program loop for storing second LSB data in second memory cells of the selected word line and for detecting over-erased memory cells having threshold voltages lower than an over-erase reference voltage of a negative potential to raise the threshold voltages to be higher than the over-erase reference voltage, performing a first MSB program loop for storing first MSB data in the first memory cells, and performing a second MSB program loop for storing second MSB data in the second memory cells.

20 Claims, 9 Drawing Sheets

FIG. 9

SEMICONDUCTOR MEMORY DEVICE AND OPERATING METHOD THEREOF

CROSS-REFERENCE TO RELATED APPLICATION

Priority to Korean patent application number 10-2011-0062183 filed on Jun. 27, 2011, the entire disclosure of which is incorporated by reference herein, is claimed.

BACKGROUND

Exemplary embodiments relate to a semiconductor memory device and an operating method thereof and, more particularly, to a semiconductor memory device including non-volatile memory cells and an operating method thereof.

As the size of a memory cell is reduced in non-volatile memory devices, such as NAND flash memory devices, an interference phenomenon may more easily occur between adjacent memory cells when a program operation is performed. Accordingly, the threshold voltages of memory cells adjacent to a programmed memory cell are greatly shifted by the interference phenomenon. Furthermore, the distribution of the threshold voltages of memory cells programmed in a target level is widened by the interference phenomenon, and an interval between the distributions of the threshold voltages of memory cells programmed in different levels is narrowed. Consequently, data stored in a memory cell may not be read properly, for example, different data may be read. This phenomenon is further increased in a Multi-Level Cell (hereinafter referred to as an 'MLC') program method of storing data of 2 bits in one memory cell.

There are being proposed several methods of reducing the interference phenomenon between the memory cells in the MLC program operation. One of the methods is described below.

Figure 1A:
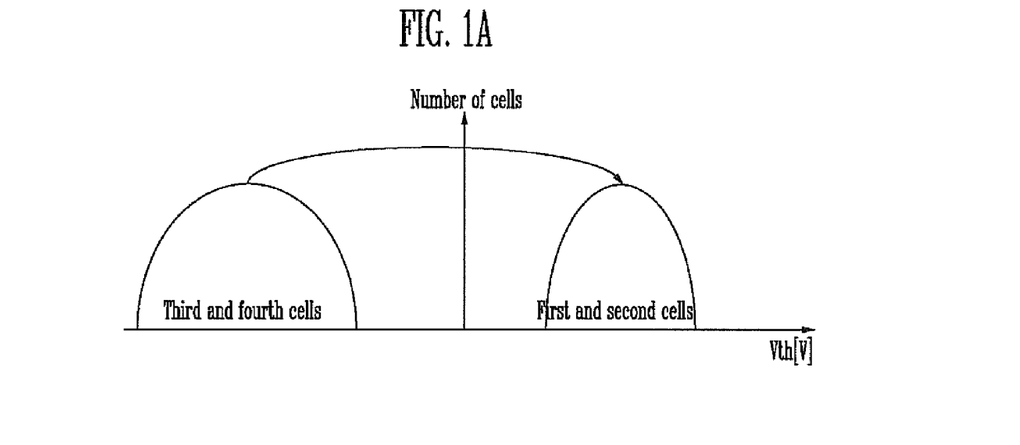
FIGS. 1A and 1B are diagrams illustrating the distributions of the threshold voltage of memory cells which are shifted by the program operation of a semiconductor memory device.
Figure 1B:
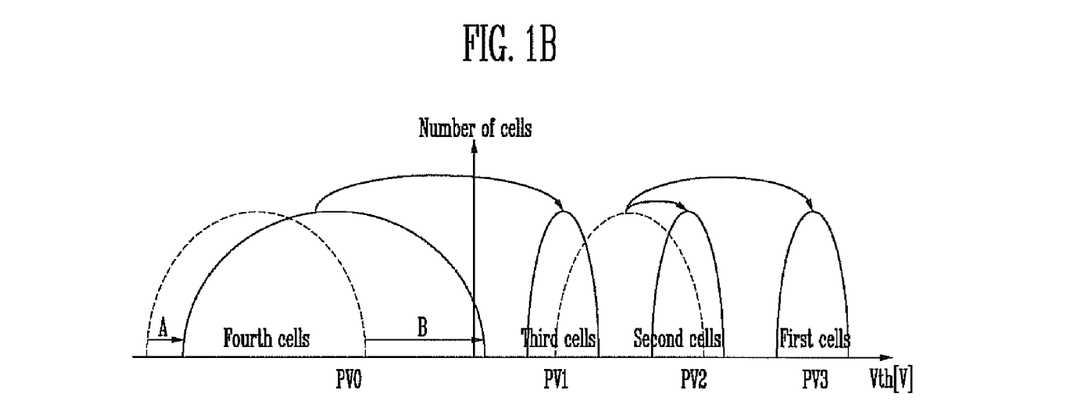

FIGS. 1A and 1B are diagrams illustrating the distributions of the threshold voltages of memory cells which are shifted by the program operation of a semiconductor memory device.

Referring to FIG. 1A, data of 2 bits includes Least Significant Bit (hereinafter referred to as an 'LSB') data and Most Significant Bit (hereinafter referred to as an 'MSB') data. The data of 2 bits is stored in a memory cell by an LSB program operation for storing the LSB data and an MSB program operation for storing the MSB data. First, when the LSB program operation is performed, the threshold voltages of first cells and second cells, from among first to fourth memory cells coupled to a selected word line, rise. Here, the first cells and the second cells may be cells to which data '0' is inputted as the LSB data, Referring to FIG. 1B, when the MSB program operation is performed, the threshold voltages of the third cells, from among the first to fourth memory cells coupled to the selected word line, rise to a first level PV1, the threshold voltages of the second cells rise to a second level PV2, and the threshold voltages of the first cells rise to a third level PV3. Here, the third cells and the first cells may be cells to which data '0' is inputted as the MSB data.

Thus, the threshold voltages of the first to fourth memory cells are distributed over the four different levels PV0, PV1, PV2, and PV3 depending on the data of 2 bits stored by the LSB program operation and the MSB program operation.

The lowest level A and the highest level B of a threshold voltage distribution of the fourth cells that are to maintain an erase level PV0 rise owing to an interference phenomenon occurring when the MSB program operation is performed. Since the threshold voltages of the third cells are greatly shifted from the erase level PV0 to the first level PV1, the rise of the threshold voltages of the third cells becomes a major cause of the rise in the threshold voltage distribution of the fourth cells.

Meanwhile, when the highest level B of the threshold voltage distribution of the fourth cells is higher than 0 V owing to the interference phenomenon, a margin between the threshold voltage distribution of the first cells and the threshold voltage distribution of the fourth cells is reduced. For this reason, an interval between a threshold voltage distribution of the second cells and a threshold voltage distribution of the third cells is narrowed. As a result, a sensing margin for distinguishing the threshold voltages of the second cells and the threshold voltages of the third cells from each other is reduced. In severe cases, an error in the operation may occur.

BRIEF SUMMARY

Exemplary embodiments relate to a semiconductor memory device and an operating method thereof, wherein an interference phenomenon occurring in adjacent memory cells when a program operation is performed may be minimized and a threshold voltage distribution of memory cells may be prevented from being shifted by the interference phenomenon.

An operating method of a semiconductor memory device according to an aspect of the present invention includes performing a first LSB program loop for storing first LSB data in first memory cells of a selected word line; performing a second LSB program loop for storing second LSB data in second memory cells of the selected word line and for raising threshold voltages of over-erased memory cells lower than an over-erase reference voltage of a negative potential, among the second memory cells, to be higher than the over-erase reference voltage; performing a first MSB program loop for storing first MSB data in the first memory cells; and performing a second MSB program loop for storing second MSB data in the second memory cells.

An operating method of a semiconductor memory device according to another aspect of the present invention includes performing a second LSB program loop for storing second LSB data in memory cells coupled to a second word line of a plurality of word lines and for raising threshold voltages of over-erased memory cells lower than an over-erase reference voltage of a negative potential, among the memory cells coupled to the second word line, to be higher than the over-erase reference voltage; performing a first MSB program loop for storing first MSB data in memory cells coupled to a first word line adjacent to the second word line on one side, among the plurality of word lines; performing a third LSB program loop for storing third LSB data in memory cells coupled to a third word line adjacent to the second word line on the other side; and performing a second MSB program loop for storing second MSB data in the memory cells coupled to the second word line.

A semiconductor memory device according to an aspect of the present invention includes a memory block including memory cells coupled to word lines; an operation circuit configured to perform a first LSB program loop for memory cells included in the even page of a word line, selected from the word lines, a second LSB program loop for memory cells included in the odd page of the selected word line, a first MSB program loop for the memory cells of the even page, and a second MSB program loop for the memory cells of the odd page; and a control circuit configured to control the operation circuit to detect over-erased memory cells having threshold voltages lower than an over-erase reference voltage of a negative potential, among the memory cells of the odd page, and raise the threshold voltages to be higher than the over-erase reference voltage while storing LSB data in the memory cells of the odd page in the second LSB program loop.

A semiconductor memory device according to another aspect of the present invention includes a memory block including memory cells coupled to word lines; an operation circuit configured to perform a second LSB program loop for memory cells coupled to a second word line of the word lines, a first MSB program loop for memory cells coupled to a first word line adjacent to the second word line on one side, a third LSB program loop for memory cells coupled to a third word line adjacent to the second word line on the other side, and a second MSB program loop for the memory cells coupled to the second word line; and a control circuit configured to control the operation circuit to detect over-erased memory cells having threshold voltages lower than an over-erase reference voltage of a negative potential, among the memory cells coupled to the second word line, and raise the threshold voltages to be higher than the over-erase reference voltage while storing LSB data in the memory cells coupled to the second word line.

DESCRIPTION OF EMBODIMENTS

Hereinafter, some exemplary embodiments of the present disclosure will be described in detail with reference to the accompanying drawings. The figures are provided to enable those of ordinary skill in the art to make and use the present invention according to the exemplary embodiments of the present invention.

Figure 2:
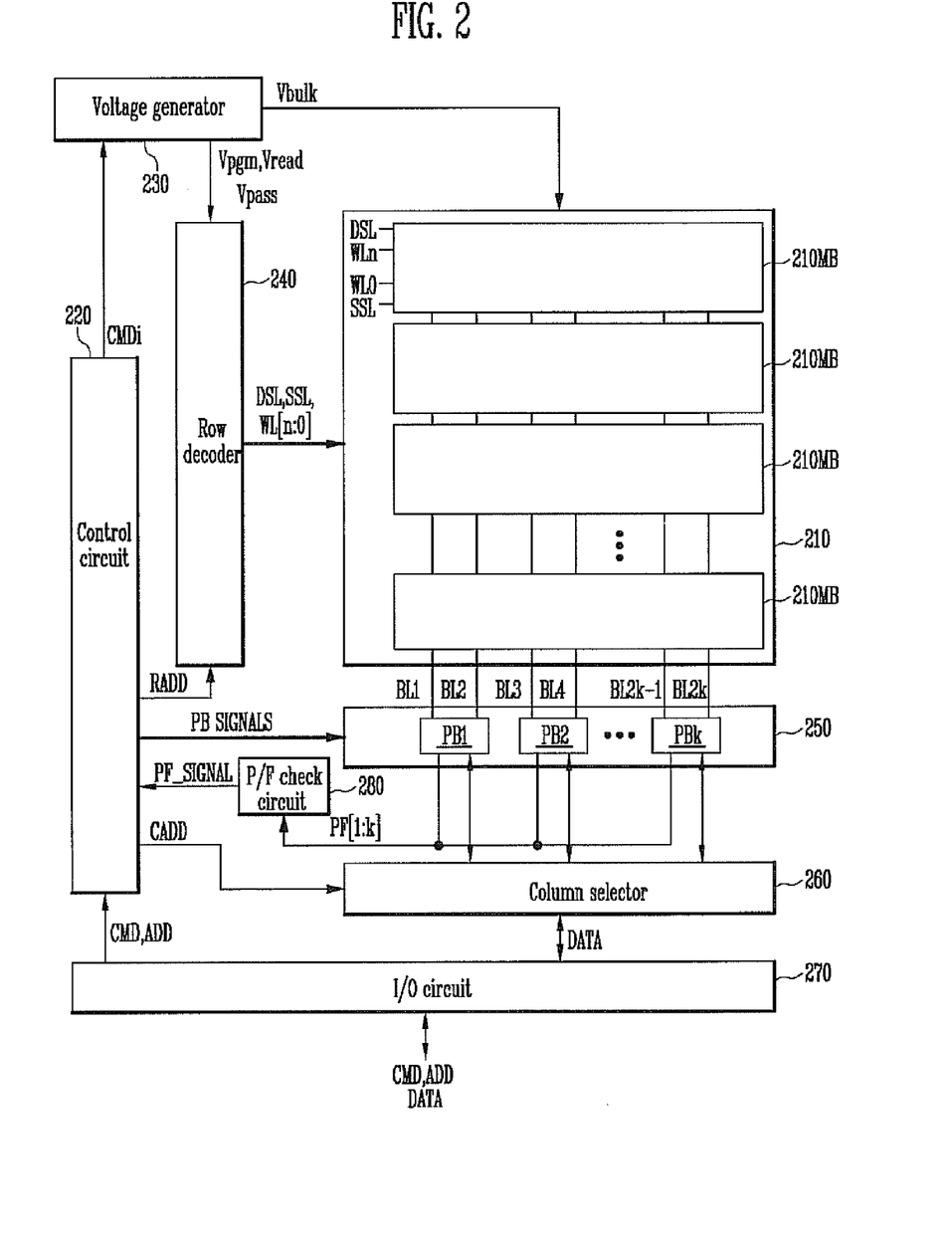
FIG. 2 is a block diagram illustrating the configuration of a semiconductor memory device according to an exemplary embodiment of the present invention.
Figure 3:
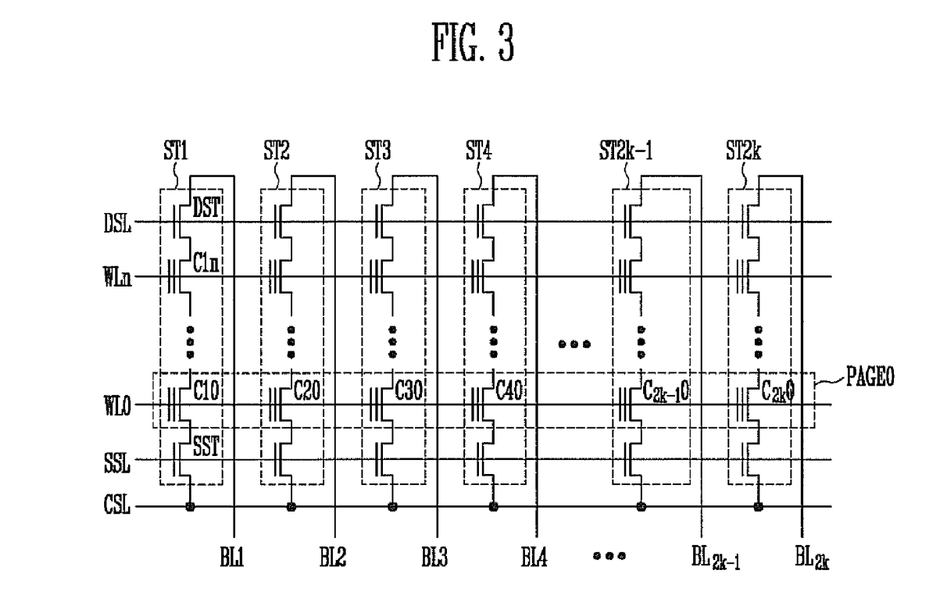
FIG. 3 is a circuit diagram of a CAM block shown in FIG. 2.

FIG. 2 is a block diagram illustrating the configuration of a semiconductor memory device according to an exemplary embodiment of this disclosure. FIG. 3 is a circuit diagram of the CAM block shown in FIG. 2.

Referring to FIG. 2, the semiconductor memory device according to the exemplary embodiment of the present invention includes a memory array 210 including a plurality of memory blocks 210MB, an operation circuit (230, 240, 250, 260, 270, and 280) configured to perform a program loop and a read loop for memory cells included in a selected word line or a selected page of one of the memory cell blocks 210MB, and a control circuit 220 configured to control the operation circuit (230, 240, 250, 260, 270, and 280). The program loop includes a program operation and a program verification operation. Particularly, the program loop is performed in an Increment Step Pulse Program (hereinafter referred to as an 'ISPP') method. For example, when a memory cell having a threshold voltage not reached a target level is detected in a program verification operation subsequent to a program operation, a program voltage may be raised and the program operation may be then performed again. The program loop is finished when the threshold voltage of the memory cell reaches the target level.

Meanwhile, in case of a NAND flash memory device, the operation circuit includes a voltage supply circuit (230 and 240), a page buffer group 250, a column selector 260, an input/output (I/O) circuit 270, and a pass/fail (P/F) check circuit 280.

The memory array 210 includes the plurality of memory blocks 210MB.

Referring to FIG. 3, each of the memory blocks 210MB includes a plurality of strings ST1 to ST2$k$ coupled between bit lines BL1 to BL2$k$ and a common source line CSL. More specifically, the strings ST1 to ST2$k$ are coupled to the respective bit lines BL1 to BL2$k$ and are in common coupled to the common source line CSL. Each (for example, ST1) of the strings ST1 to ST2$k$ includes a source select transistor SST having a source coupled to the common source line CSL, a plurality of memory cells C10 to C1$n$, and a drain select transistor DST having a drain coupled to the bit line BL1. The memory cells C10 to C1$n$ are coupled in series between the select transistors SST and DST. The gate of the source select transistor SST is coupled to a source select line SSL, the gates of the memory cells C10 to C1$n$ are coupled to respective word lines WL0 to WL$n$, and the gate of the drain select transistor DST is coupled to a drain select line DSL.

In a NAND flash memory device, memory cells included in a memory cell block may be divided into physical pages and logical pages. For example, the memory cells C10 to C2$k$0 coupled to one word line (for example, WL0) may form one physical page PAGE0. Furthermore, the odd-numbered memory cells C10, C30, and to C2$k$-10 coupled to the word line WL0 may form one odd physical page, and the even-numbered memory cells C20, C40 to C2$k$0 coupled to the word line WL0 may form one even physical page. The page (or the even page and the odd page) is a basic unit for a program operation or a read operation.

Referring to FIGS. 2 and 3, the control circuit 220 generates a command signal CMDi for performing a program loop or a read loop in response to a command signal CMD externally received through the I/O circuit 270 and also generates pager buffer control signals PB_SIGNALS for controlling the page buffers PB1 to PB$k$ of the page buffer group 250 depending on a type of an operation. An operation of the control circuit 220 controlling the page buffers PB1 to PB$k$ of the page buffer group 250 is described later. Furthermore, the control circuit 220 generates a row address signal RADD and a column address signal CADD in response to an address signal ADD externally received through the I/O circuit 270.

The voltage supply circuit (230 and 240) supplies the drain select line DSL, the word lines WL0 to WL$n$, and the source select line SSL of a selected memory block with operating voltages (for example, Vpgm, Vread, and Vpass) for the program loop or the read loop of selected memory cells in response to the command signal CMDi of the control circuit 220. The voltage supply circuit includes the voltage generator 230 and the row decoder 240.

The voltage generator 230 supplies the operating voltages for the program loop or the read loop of memory cells to global lines in response to the command signal CMDi. For example, for a program loop, the voltage generator 230 may output the program voltage Vpgm to be supplied to memory cells, included in a selected page, and the pass voltage Vpass to be supplied to unselected memory cells, included in the selected page, to the global lines. For a read loop, the voltage generator 230 may output the read voltage Vread to be supplied to memory cells, included in a selected page, and the pass voltage Vpass to be supplied to unselected memory cells, included in the selected page, to the global lines.

The row decoder 240 couples the global lines and the local lines DSL, WL0 to WLn, and SSL in response to the row address signals RADD so that the operating voltages of the voltage generator 230 may be transferred to the local lines DSL, WL0 to WLn, and SSL of the memory block 210MB selected from the memory array 210. Thus, the program voltage Vpgm or the read voltage Vread of the voltage generator 230 is supplied to a local word line (for example, WL0), coupled to a selected cell (for example, C10) included in a selected page (for example, ST1), through a global word line. Furthermore, the pass voltage Vpass of the voltage generator 230 is supplied to local word lines WL1 to WLn, coupled to unselected cells C11 to C1n, through the global the word lines. Accordingly, data is stored in the selected cell C10 by the program voltage Vpgm or data stored in the selected cell C10 is read out by the read voltage Vread.

The page buffer group 250 includes the plurality of page buffers PB1 to PBk coupled to the memory array 210 through the bit lines BL1 to BL2k. The page buffers PB1 to PBk of the page buffer group 250 selectively precharge the bit lines BL1 to BL2k depending on input data in order to store the input data in the memory cells C10 to C2k0 in response to the control signal PB_SIGNALS or sense the voltages of the bit lines BL1 to BL2k in order to read data from the memory cells Ca0 to C2k0.

For example, in a program loop, when program data (for example, data '0') is received in order to store the program data in a memory cell, a relevant page buffer may supply a program permission voltage (for example, a ground voltage) to a bit line coupled to the memory cell. When erase data (for example, data '1') is received in order to store the erase data in a memory cell, a relevant page buffer may supply a program inhibition voltage (for example, a power source voltage) to a bit line coupled to the memory cell.

In a read loop, the page buffer group 250 precharges all the odd bit lines BL1 to BL2k-1 or all the even bit lines BL2 to BL2k. When the read voltage Vread is supplied to memory cells included in a selected page, bit lines coupled to some of the memory cells in which program data is stored maintain the precharge state, and bit lines coupled to the remaining memory cells in which erase data is stored are discharged. The page buffer group 250 senses a change in the voltages of the bit lines BL1 to BL2k-1 or BL2 to BL2k and latches the data of memory cells corresponding to the result of the sensing.

Each of the page buffers PB1 to PBk may be coupled to a pair of the bit lines BL1 to BL2k, including an even bit line and an odd bit line or may be coupled to each of the bit lines BL1 to BL2k. For example, if memory cells coupled to one word line are divided into an even page and an odd page and a program loop or a read loop for the even page and the odd page is performed, each of the page buffers may be coupled to a pair of the bit lines, including an even bit line and an odd bit line. For another example, if a program loop or a read loop for all memory cells coupled to one word line is performed at the same time, the page buffers may be coupled the respective bit lines. A detailed construction of the page buffer is described later.

The page buffers PB1 to PBk store data to be stored in memory cells in a program operation, store a difference between the threshold voltages of memory cells and a verification voltage in a verification operation, and generate P/F check signals PF[1:k} in order to detect a memory cell having a threshold voltage lower than a target level.

The P/F check circuit 280 checks whether there is a memory cell having a threshold voltage lower than a target level by sensing the P/F check signals PF[1:k] and generates P/F check signals PF_SIGNALS for determining whether to perform a program loop to the control circuit 220 depending on a result of the check. If, as a result of the check, a memory cell having a threshold voltage lower than the target level is not detected, the control circuit 220 outputs a changed row address signal RADD and a new command signal CMDi to the voltage supply circuit (230 and 240) in order to perform a program loop for a next word line (or a next page) in response to the P/F check signals PF_SIGNALS. If, as a result of the check, a memory cell having a threshold voltage lower than the target level is detected, however, the control circuit 220 raises the program voltage Vpgm in response to the P/F check signals PF_SIGNALS and controls the voltage supply circuit (230 and 240) and the page buffer group 250 so that a program loop is performed again.

The column selector 260 selects the page buffers PB1 to PBk of the page buffer group 250 in response to the column address signal CADD of the control circuit 220. More specifically, the column selector 260 sequentially transfers data to be stored in the memory cells to the page buffers PB1 to PBk in response to the column address signal CADD. Furthermore, the column selector 260 sequentially selects the page buffers PB1 to PBk in response to the column address signal CADD so that data of the memory cells stored in the page buffers PB1 to PBk is externally outputted in a read operation.

The I/O circuit 270 transfers external data DATA to the column selector 260 under the control of the control circuit 220 in a program operation so that the external data is inputted to the page buffer group 250 and then stored in the memory cells. When the column selector 260 sequentially transfers the external data to the page buffers PB1 to PBk of the page buffer group 250, the page buffers PB1 to PB2k latch the received data. Furthermore, in a read operation, the I/O circuit 270 externally outputs data DATA received from the page buffers PB1 to PBk via the column selector 260.

Figure 4:
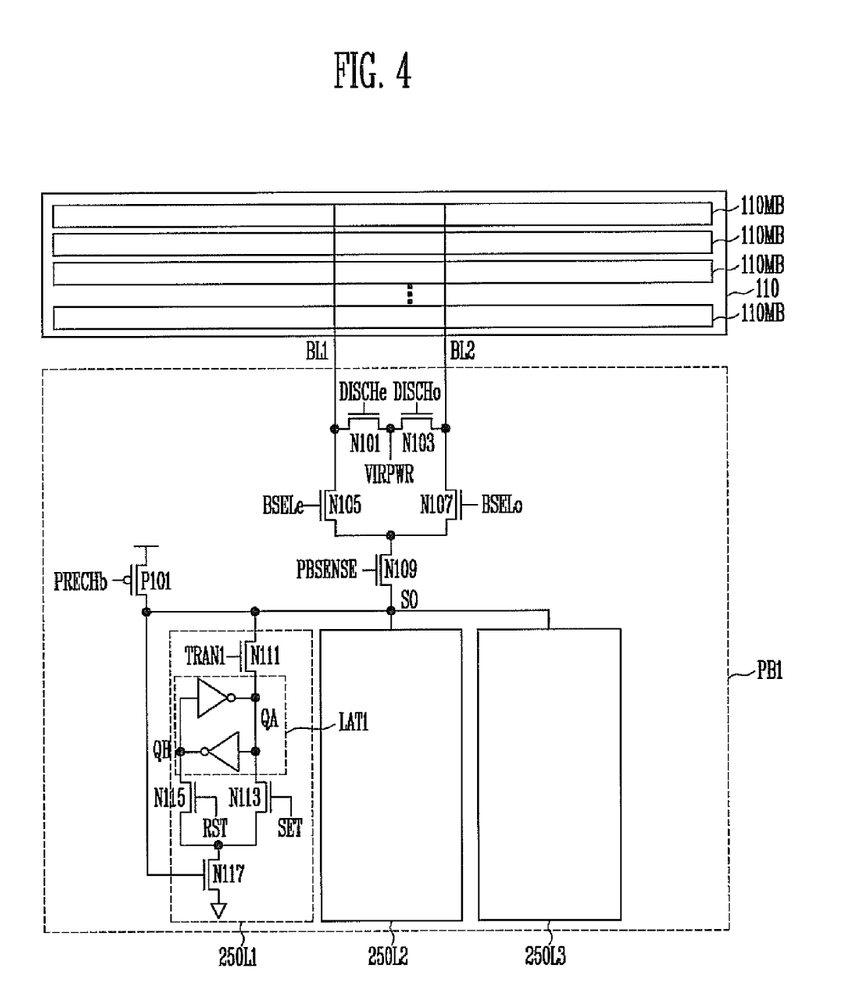
FIG. 4 is a circuit diagram of a page buffer shown in FIG. 2.

FIG. 4 is a circuit diagram of one (for example, PB1) of the page buffers PB1 to PBk shown in FIG. 2. The page buffer PB1 coupled to a pair of an even bit line BLe1 and an odd bit line BLo1 is shown as an example in FIG. 4.

Referring to FIG. 4, the page buffer PB1 is operated under the control of the control circuit 120. Signals PRECHb, TRAN1, RST, SET, PBSENSE, BSELe, BSELo, DISCHe, and DISCHo to be described later may be generated by the control circuit 120.

The page buffer PB1 includes a bit line select circuit (N101, N103, N105, and N107), a bit line coupling circuit N109, a precharge circuit P101, and a plurality of latch circuits. In FIG. 4, only three first to third latch circuits 250L1 to 250L3 are shown for simplicity, but it is to be noted that the number of latch circuits may be changed.

The bit line select circuit (N101, N103, N105, and N107) couples a bit line, selected from the even bit line BLe1 and the odd bit line BLo1, to the page buffer PB1 in response to the bit line select signal BSELe or BSELo and precharges or discharges an unselected bit line in response to a discharge signal DISCHe or DISCHo. The switching elements N101 and N103 precharge an unselected bit line in a program operation or discharge an unselected bit line in a read operation by using voltage generated from a virtual voltage source VIRPWR. The switching elements N105 and N107 couple a selected bit line to the page buffer PB1.

The bit line coupling circuit N109 couples a bit line, selected by the switching elements N105 and N107 of the bit line select circuit, to one of the first to third latch circuits 250L1 to 250L3 in response to a coupling signal PBSENSE. The first to third latch circuits 250L1 to 250L3 are coupled in parallel to the bit line coupling circuit N109. A coupling node of the bit line coupling circuit N109 and the first to third latch circuits 250L1 to 250L3 is a sense node SO.

The precharge circuit P101 precharges the sense node SO in response to a precharge signal PRECHB.

In general, only one of the first to third latch circuits 250L1 to 250L3 is activated. The first latch circuit 250L1 may be used to store LSB data to be stored in a memory cell or LSB data read out from a memory cell. The second latch circuit 250L2 may be used to store MSB data to be stored in a memory cell or MSB data read out from a memory cell. In a program operation, the first to third latch circuits 250L1 and 250L2 supply a program inhibition voltage (for example, a power supply voltage) or a program permission voltage (for example, a ground voltage) to the bit line BLe1 or BLo1 depending on data stored therein.

Meanwhile, the third latch circuit 250L3 may be used to store a value corresponding to the voltage of the bit line BLe1 or BLo1 which is sensed in a verification operation. Here, the value determines one of the P/F check signals PF[1:k] outputted to the P/F check circuit 280.

The first to third latch circuits 250L1 to 250L3 may have the same construction, but may have different construction for a circuit design. Furthermore, input signals TRAN1, RST, and SET may have different waveforms. Since the signals of different waveforms are inputted to the first to third latch circuits 250L1 to 250L3, only one of the first to third latch circuits 250L1 to 250L3 is activated or the first to third latch circuits 250L1 to 250L3 may perform different functions although the first to third latch circuit have the same construction.

The first latch circuit 250L1 is described as an example. The first latch circuit 250L1 includes a latch LAT1 for latching data, a switching element N111 configured to couple the first node QA of the latch LAT1 to the sense node SO in response to a transfer signal TRAN1, switching elements N113 and N115 coupled to the first and the second nodes QA and QB of the latch LAT1 and operated in response to a set signal SET and a reset signal RST, and a switching element N117 coupled between the switching elements N113 and N115 and a ground terminal and operated in response to the potential of the sense node SO. For reference, when the page buffer PB1 is selected, the column selector 260 may be coupled to the first and the second nodes QA and QB of the latch LAT1 of the page buffer PB1 in response to the column address signal CADD.

Figure 5:
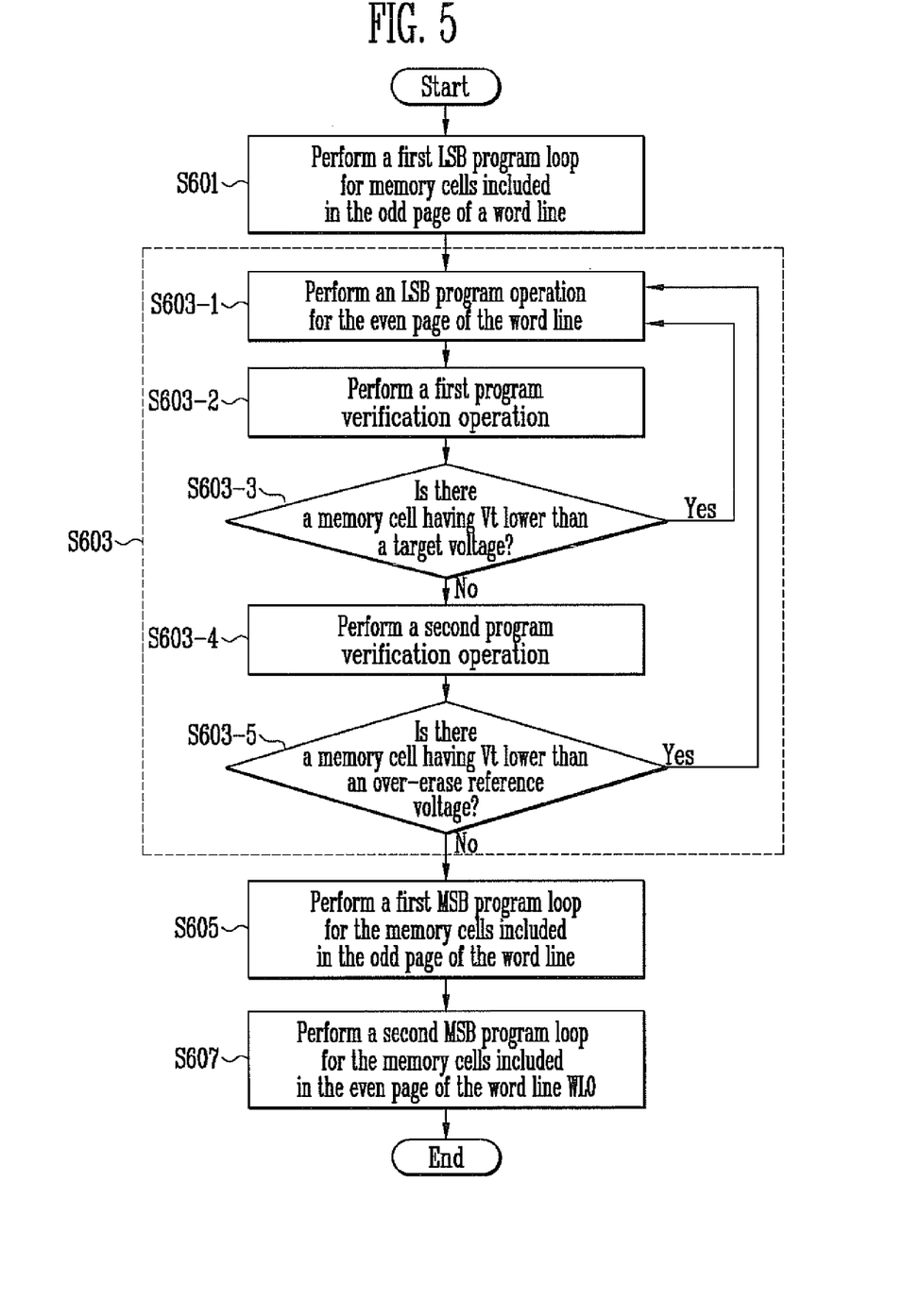
FIG. 5 is a flowchart illustrating the operating method of the semiconductor memory device according to an exemplary embodiment of the present invention.

FIG. 5 is a flowchart illustrating the operating method of the semiconductor memory device according to an exemplary embodiment of the present invention. FIGS. 6A to 6D are diagrams illustrating the distributions of the threshold voltage of memory cells which are shifted by the operating method of the semiconductor memory device according to the exemplary embodiment of the present invention. It is hereinafter described as an example that the memory block 210MB of FIG. 3 is selected and the word line WL0 is selected from the word lines WL0 to WLn of FIG. 3.

Referring to FIGS. 2, 3, 5, and 6A, at step S601, a first LSB program loop is performed for the memory cells C10, C30 to C2k-10 included in the odd page of the word line WL0. In order to perform the first LSB program loop, LSB data to be stored in the memory cells C10, C30 to C2k-10 of the odd page is first inputted to the operation circuit (particularly, the page buffer group 250) that performs the first LSB program loop.

Figure 6A:
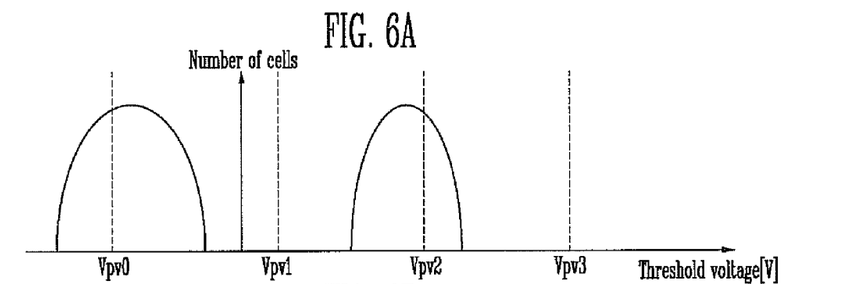
FIGS. 6A to 6D are diagrams illustrating the distributions of the threshold voltage of memory cells which are shifted by the operating method of the semiconductor memory device according to the exemplary embodiment of the present invention.

When the operation circuit performs the first LSB program loop, the threshold voltages of some of the memory cells C10, C30 to C2k-10 become higher than an LSB verification voltage depending on the LSB data stored in the memory cells C10, C30 to C2k-10 of the odd page. As a result the threshold voltages of the memory cells C10, C30 to C2k-10 are divided into two distributions. For example, the threshold voltages of memory cells in which data '1' is stored as the LSB data may maintain an erase state, and the threshold voltages of memory cells in which data '0' is stored as the LSB data may become higher than 0 V.

The first LSB program loop includes a first LSB program operation and a first LSB program verification operation.

In the first LSB program operation, the program inhibition voltage (for example, a power supply voltage) is supplied to bit lines coupled to the memory cells C20, C40, and C2k0 included in the even page of the word line WL0. Furthermore, the program permission voltage (for example, a ground voltage) is supplied to bit lines coupled to the memory cells in which data '0' will be stored as the LSB data, from among the memory cells C10, C30, and C2k-10 of the odd page, and the program inhibition voltage (for example, a power supply voltage) is supplied to bit lines coupled to the memory cells in which 'data '1' will be stored (i.e., program-inhibition cells), from among the memory cells C10, C30, and C2k-10 of the odd page. Next, when the program voltage Vpgm is supplied to the word line WL0, the voltage of a channel region rises in the memory cells of the even page and the program-inhibition cells of the odd page, due to a channel boosting phenomenon occurring owing to the program inhibition voltage and the program voltage Vpgm. Thus, the threshold voltages of the memory cells of the even page and the program-inhibition cells of the odd page are not shifted because a difference in the voltage between the word line WL0 and the channel region is reduced. Furthermore, since the ground voltage is supplied to the channel region of the memory cells in which data '0' will be stored, from among the memory cells C10, C30, and C2k-10 of the odd page, the threshold voltages of the memory cells C10, C30, and C2k-10 rise owing to a difference between the program voltage Vpgm and the ground voltage.

Next, in the first LSB program verification operation, it is checked whether there is a memory cell having a threshold voltage lower than the LSB verification voltage, from among the memory cells in which data '0' will be stored as the LSB data. If, as a result of the check, there is a memory cell having a threshold voltage lower than the LSB verification voltage, the program voltage Vpgm is raised by a step voltage, and the first LSB program operation is performed again. In the first program verification operation, it is checked whether there is a memory cell having a threshold voltage lower than the LSB verification voltage.

The first LSB program loop, including the first LSB program operation and the first LSB program verification operation, is repeatedly performed until the threshold voltages of all the memory cells in which data '0' will be stored become higher than the LSB verification voltage. All program loops to be described later may be performed like the first LSB program loop.

Referring to FIGS. 2, 3, 5, and 6B, at step S603, a second LSB program loop is performed for the memory cells C20, C40 to C2k0 included in the even page of the word line WL0. In order to perform the second LSB program loop, the LSB data to be stored in the memory cells C20, C40 to C2k0 of the even page is first inputted to the operation circuit (particularly, the page buffer group 250) that performs the second LSB program loop.

Figure 6B:
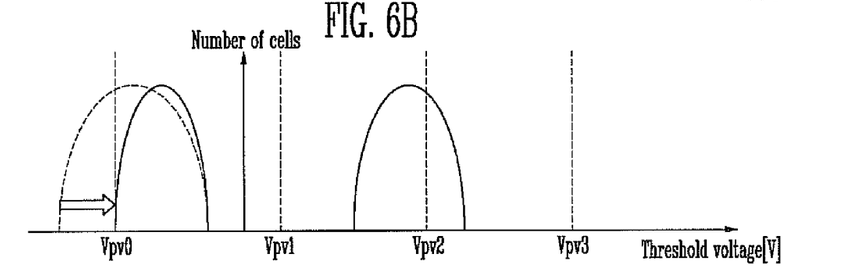
Figure 6C:
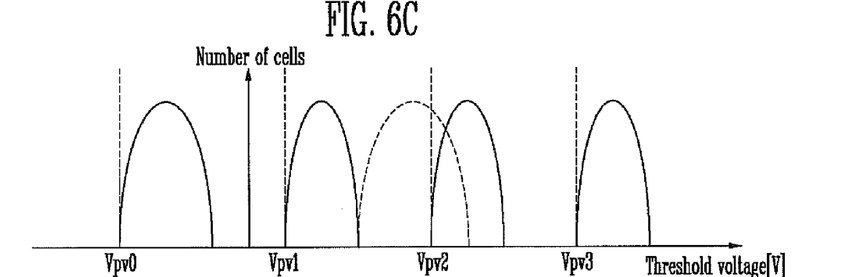

When the operation circuit performs the second LSB program loop, the threshold voltages of some of the memory cells C20, C40 to C2k0 become higher than 0 V depending on the LSB data stored in the memory cells C20, C40 to C2k0 of the even page. As a result the threshold voltages of the memory cells C20, C40 to C2k0 are divided into two distributions. For example, the threshold voltages of memory cells in which data '1' is stored as the LSB data may maintain an erase state, and the threshold voltages of memory cells in which data '0' is stored as the LSB data may become higher than 0 V.

Unlike in the first LSB program loop, in the second LSB program loop, the threshold voltage of an over-erased memory cell, which is lower than an over-erase reference voltage Vpv0 of a negative potential, from among the memory cells of an erase state belonging to the even page, is raised higher than the over-erase reference voltage Vpv0. The reason why the threshold voltage of the over-erased memory cell is raised higher than the over-erase reference voltage Vpv0 is to minimize an interference phenomenon occurring in the memory cells of the odd page while an MSB program loop for the even page is subsequently performed. This is described in detail below.

After the second LSB program loop of the even page is finished, a first MSB program loop for the odd page and a second MSB program loop for the even page are consecutively performed. Since the first MSB program loop of the odd page is finished and the second MSB program loop of the even page is performed, the threshold voltages of the memory cells included in the odd page, in which all data including MSB data has been stored, are raised owing to an interference phenomenon when the second MSB program loop of the even page is performed. In particular, while the threshold voltages of over-erased memory cells, from among the memory cells of an erase state belonging to the even page, are raised to a program verification voltage (for example, Vpv1) higher than 0 V, in the second MSB program loop, the memory cells of the odd page are subject to a severe interference phenomenon. For this reason, prior to the first MSB program loop of the odd page (that is, before all operations for storing data in the memory cells of the odd page are finished), the threshold voltages of over-erased memory cells included in the even page are raised higher than the over-erase reference voltage Vpv0 in advance. In this case, an interference phenomenon occurring in the memory cells of the odd page on which the operation of storing data has been finished may be reduced during the second MSB program loop of the even page.

Accordingly, a distribution of the threshold voltages of the memory cells having an erase state may be narrowed, and the threshold voltages of the memory cells having an erase state become higher than the over-erase reference voltage Vpv0.

As a result, an interference phenomenon occurring in the memory cells C10, C30 to C2k-10 of the odd page may be reduced.

In order to raise the threshold voltages of the over-erased memory cells so that they are higher than the over-erase reference voltage Vpv0 of a negative potential, the second LSB program loop of the even page includes an LSB program operation S603-1, a first program verification operation (S603-2 and S603-3) for checking whether there is a memory cell having a threshold voltage lower than 0 V or an LSB verification voltage higher than 0 V, and a second program verification operation (S603-4 and S603-5) for checking whether there is an over-erased memory cell having a threshold voltage lower than the over-erase reference voltage Vpv0. The LSB program operation, the first program verification operation, and the second program verification operation are described in detail below.

At step S603-1, when the LSB program operation is first performed, whether there is an over-erased memory cell or what cell is an over-erased memory cell may not be checked. For this reason, the threshold voltages of only memory cells selected depending on the LSB data stored in the memory cells of the even page are raised.

Next, the first program verification operation (S603-2 and S603-3) is performed. First, bit lines coupled to the selected memory cells are precharged, and the LSB verification voltage higher than the first program verification voltage Vpv1, but lower than a second program verification voltage Vpv2 is supplied to the word line WL0 at step S603-2. It is determined whether there is a memory cell having a threshold voltage lower than the LSB verification voltage by sensing a change in the voltages of the bit lines at step S603-3. If, as a result of the determination at step S603-3, a memory cell having a threshold voltage lower than the LSB verification voltage is determined to exist, the LSB program operation is performed again at step S603-1. In this case, the LSB program operation may be performed after the program voltage Vpgm is raised by a step voltage.

Next, the second program verification operation (S603-4 and S603-5) is performed. If, as a result of the determination at step S603-3, a memory cell having a threshold voltage lower than the LSB verification voltage is determined not to exist, the bit lines are precharged and the over-erase reference voltage Vpv0 is supplied to the word line WL0 at step S603-4. It is then determined whether there is an over-erased memory cell having a threshold voltage lower than the over-erase reference voltage Vpv0 by sensing a change in the voltages of the bit lines at step S603-5. If, as a result of the determination at step S603-5, an over-erased memory cell having a threshold voltage lower than the over-erase reference voltage Vpv0 is determined to exist, the LSB program operation is performed again at step S603-1. In this case, the LSB program operation is performed in order to raise the threshold voltage of the over-erased memory cell having the threshold voltage lower than the over-erase reference voltage Vpv0.

More specifically, if, as a result of the determination at step S603-5, an over-erased memory cell having a threshold voltage lower than the over-erase reference voltage Vpv0 of a negative potential is determined to exist, the page buffer group 250 supplies the program permission voltage (for example, a ground voltage) to a bit line coupled to the detected over-erased memory cell and supplies the program inhibition voltage (for example, a power supply voltage) to the remaining bit lines. Furthermore, the voltage supply circuit (130 and 140) supplies the program voltage Vpgm to the memory cells of the selected page in order to raise the threshold voltages of the over-erased memory cells.

Here, the LSB program operation and the first program verification operation for the even page may be performed according to a known method, but the second program verification operation is to be performed in a different manner because the threshold voltage of a memory cell is compared with an over-erase reference voltage of a negative potential in a NAND flash memory using only a positive voltage. A detailed example thereof is described later.

Figure 7:
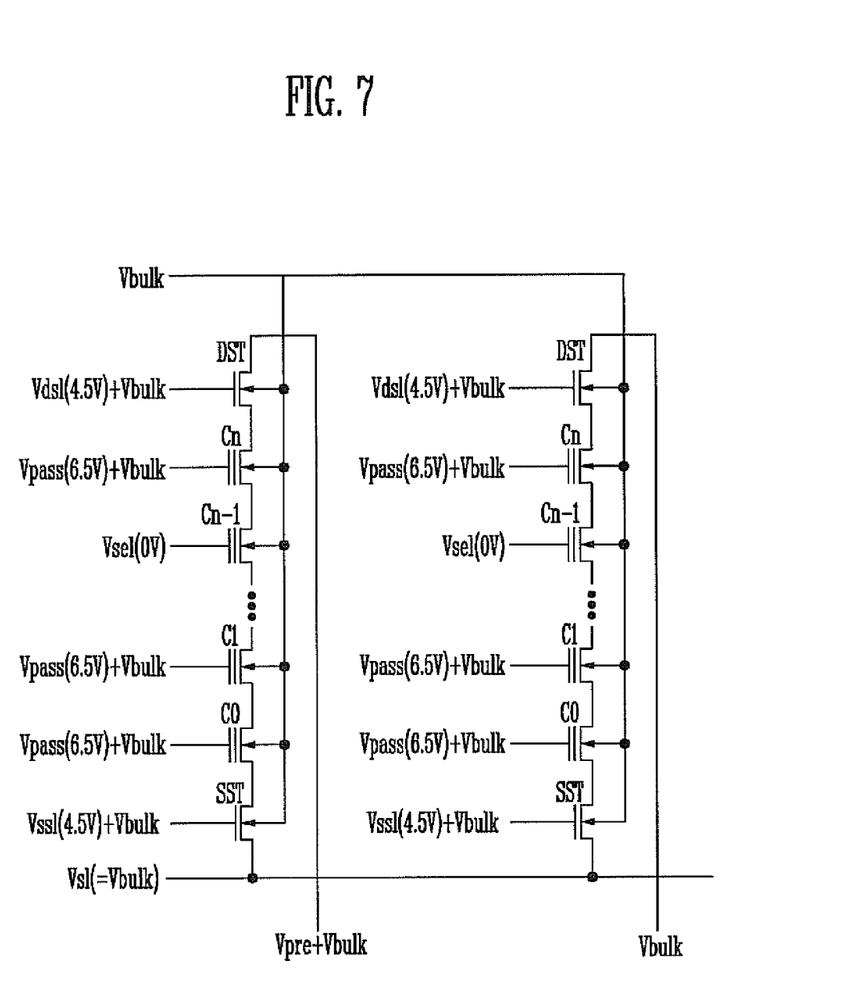
FIG. 7 is a circuit diagram illustrating voltages supplied in a verification operation in the operating method of the semiconductor memory device according to the exemplary embodiment of the present invention.

FIG. 7 is a circuit diagram illustrating voltages supplied in the verification operation in the operating method of the semiconductor memory device according to the exemplary embodiment of the present invention.

Referring to FIG. 7, after the LSB program operation, in order to detect an over-erased memory cell having a threshold voltage lower than the over-erase reference voltage Vpv0 of a negative potential, a ground voltage Vsel (for example, 0 V) is supplied to the memory cells of a selected memory block, and a bulk voltage Vbulk of a positive potential is supplied to a bulk (for example, a P-well) in which the memory cells are formed. The positive bulk voltage Vbulk has a level corresponding to the absolute value of the over-erase reference voltage Vpv0 having a negative potential. When the bulk voltage Vbulk of a positive potential is supplied to the bulk, a pass voltage (Vpass+Vbulk) raised by the bulk voltage Vbulk of a positive potential is supplied to word lines coupled to memory cells included in unselected pages, and a precharge voltage (Vpre+Vbulk) raised by the bulk voltage Vbulk of a positive potential is also supplied to bit lines coupled to the memory cells included in unselected pages. Furthermore, voltages Vdsl+Vbulk, Vssl+Vbulk, and Vsl+Vbulk each raised by the bulk voltage Vbulk of a positive potential are supplied to the select lines DSL and SSL and the source line SL, respectively. Thus, a difference in the voltage between the bulk and a word line coupled to memory cells included in a selected page corresponds to over-erase reference voltage Vpv0 of a negative potential. Accordingly, there is an effect that a verification voltage of a negative potential corresponding to the over-erase reference voltage Vpv0 of a negative potential is supplied to the memory cells.

If the voltages are supplied as described above, the precharge voltage Vpre+Vbulk supplied to bit lines coupled to memory cells having threshold voltages lower than the over-erase reference voltage Vpv0 of a negative potential is discharged, and the precharge voltage Vpre+Vbulk supplied to bit lines coupled to memory cells having threshold voltages higher than the over-erase reference voltage Vpv0 of a negative potential remains unchanged. As described above, the page buffer group 250 detects memory cells having threshold voltages lower than the over-erase reference voltage Vpv0 by sensing a change in the voltages of bit lines.

After the LSB program loop of the even page is finished at step S603, the distribution of the threshold voltages of the memory cells C20, C40, and C2k0 included in the even page of the word line WL0 is divided into a distribution of the threshold voltages of memory cells of an erase state, which are lower than 0 V, but higher than the over-erase reference voltage Vpv0, and a distribution of the threshold voltages of memory cells which are higher than 0 V.

Referring to FIGS. 3 and 5, at step S605, a first MSB program loop is performed for the memory cells C10, C30 to C2k-10 included in the odd page of the word line WL0. In the first MSB program loop, a distribution of the threshold voltages of the memory cells C10, C30 to C2k-10 of the odd page is classified into four distributions depending on MSB data stored in the memory cells C10, C30 to C2k-10 of the odd page. For example, from among memory cells in which data '1' data is stored as the MSB data, the threshold voltages of memory cells in which data '1' is stored as LSB data may not be shifted, and the threshold voltages of memory cells in which data '0' is stored as the LSB data may become higher than the first program verification voltage Vpvi. From among memory cells in which data '0' data is stored as the MSB data, the threshold voltages of memory cells in which data '1' is stored as LSB data may rise to the second program verification voltage Vpv2, and the threshold voltages of memory cells in which data '0' is stored as the LSB data may rise to a third program verification voltage Vpv3.

Accordingly, all the LSB data and the MSB data are stored in the memory cells C10, C30 to C2k-10 of the odd page.

Referring to FIGS. 2, 3, and 5, at step S607, a second MSB program loop is performed for the memory cells C20, C40 to C2k0 included in the even page of the word line WL0. Prior to the second MSB program loop, MSB data is inputted to the operation circuit (particularly, the page buffer group 250) that performs the second MSB program loop.

Like in the first MSB program loop, the threshold voltages of the memory cells C20, C40 to C2k0 included in the even page are increased to one of the first to third program verification voltages Vpv1, Vpv2, and Vpv3 depending on the MSB data stored in the memory cells C20, C40 to C2k0 of the even page. Thus, a distribution of the threshold voltages of the memory cells C20, C40 to C2k0 included in the even page is classified into four distributions. Accordingly, all the LSB data and the MSB data are stored in the memory cells C20, C40 to C2k0 of the even page.

In the second MSB program loop, since the threshold voltages of the memory cells of the even page, which has been raised higher than the over-erase reference voltage Vpv0 in the second LSB program loop, are raised to the first program verification voltage Vpv1, an increasing amount of the threshold voltages is reduced. Thus, an interference phenomenon occurring in the memory cells C10, C30 to C2k-10 of the odd page during the second MSB program loop is reduced. As a result a shift in the threshold voltages of the memory cells C10, C30 to C2k-10 included in the odd page during the second MSB program loop is minimized.

Meanwhile, as another exemplary embodiment of the LSB program operation for the even page, the threshold voltages of memory cells programmed with the first program verification voltage Vpv1, from among the over-erased memory cells, may be raised higher than the over-erase reference voltage Vpv0, while the threshold voltage of all the over-erased memory cells are raised higher than the over-erase reference voltage Vpv0 in FIG. 6B.

Referring to FIGS. 2, 3, 5, and 6D, the second LSB program loop may be performed so that, from among the over-erased memory cells, only an over-erased memory cell having a threshold voltage rise to one (preferably, the first program verification voltage Vpv1) of the first to third program verification voltages Vpv1, Vpv2, and Vpv3 in the second MSB program loop selectively raises the threshold voltage higher than a target voltage (i.e., the over-erase reference voltage Vpv0). In this case, prior to the second LSB program loop, not only the LSB data to be stored in the memory cells C20, C40 to C2k0 of the even page, but also the MSB data to be stored in the memory cells C20, C40 to C2k0 of the even page are to be inputted to the operation circuit (particularly, the page buffer group 250). When the MSB data is inputted, the page buffer group 250 may selectively control the voltages of bit lines coupled to the selected over-erased memory cells the threshold voltage of which are raised from an erase level to a program level in the subsequent MSB program loop. An operation for the page buffer group to selectively control the voltage of the bit line as described above is known, and a detailed description thereof is omitted.

Figure 6D:
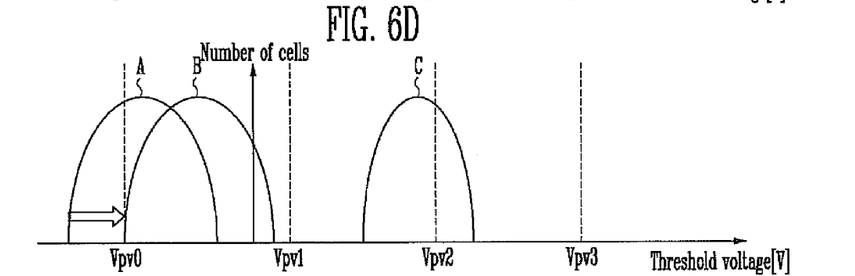

If the threshold voltages of only selected over-erased memory cells are raised as described above, after the second LSB program loop is finished, the distributions of the threshold voltages of the memory cells C20, C40 to C2k0 are divided into a distribution A of the threshold voltages of memory cells having an erase state, a distribution B of the threshold voltages of memory cells of an erase state to be raised to the first program verification voltage, and a distribution C of the threshold voltages of memory cells to be raised to the second program verification voltage or the third program verification voltage, as in FIG. 6D.

An example that the program loop is separately performed for the even page and the odd page has been described. In some embodiments, however, even when one page buffer is coupled to one bit line and LSB data or MSB data is simultaneously stored in the memory cells coupled to the word line WL0, the threshold voltages of over-erased memory cells may be raised higher than a negative target voltage in the LSB program operation. This is described in detail below.

Figure 8:
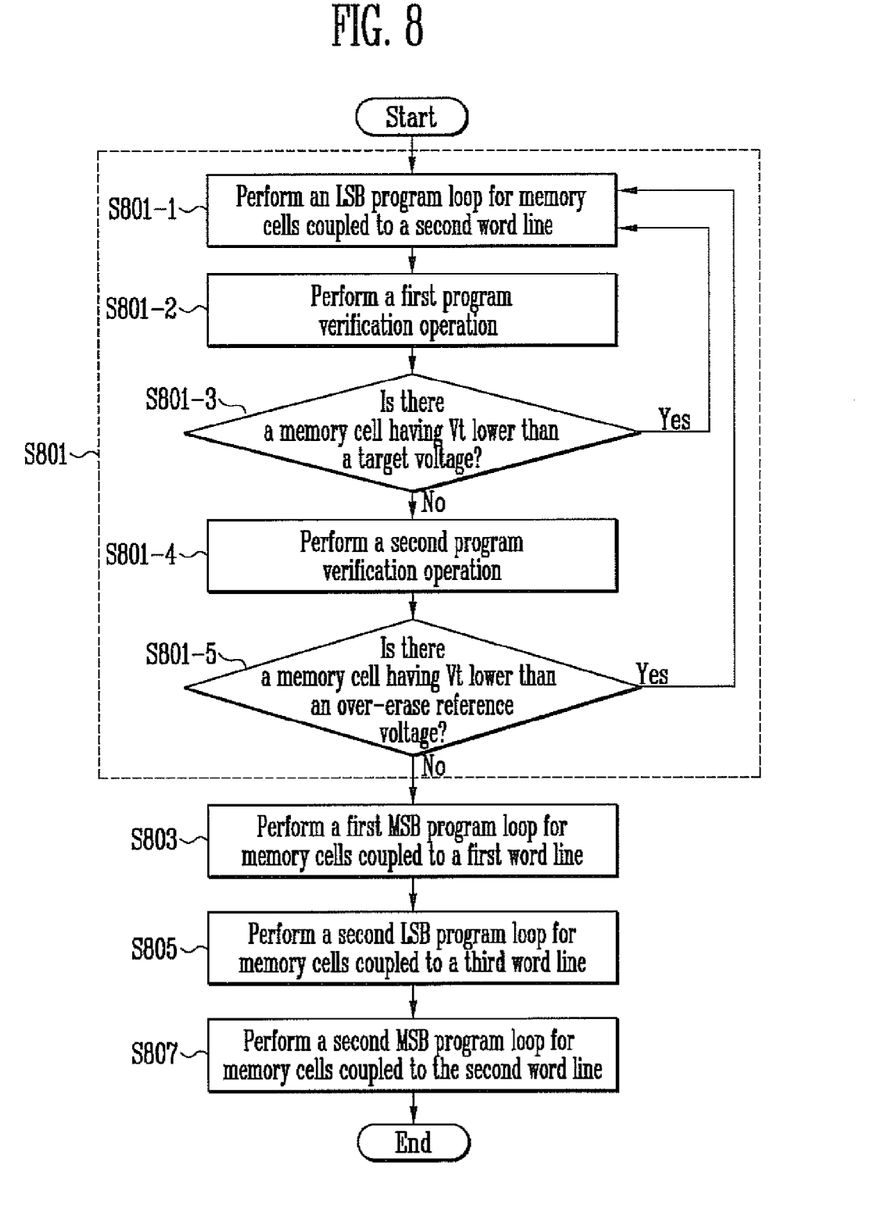
FIG. 8 is a flowchart illustrating the operating method of the semiconductor memory device according to another exemplary embodiment of the present invention.
Figure 9:
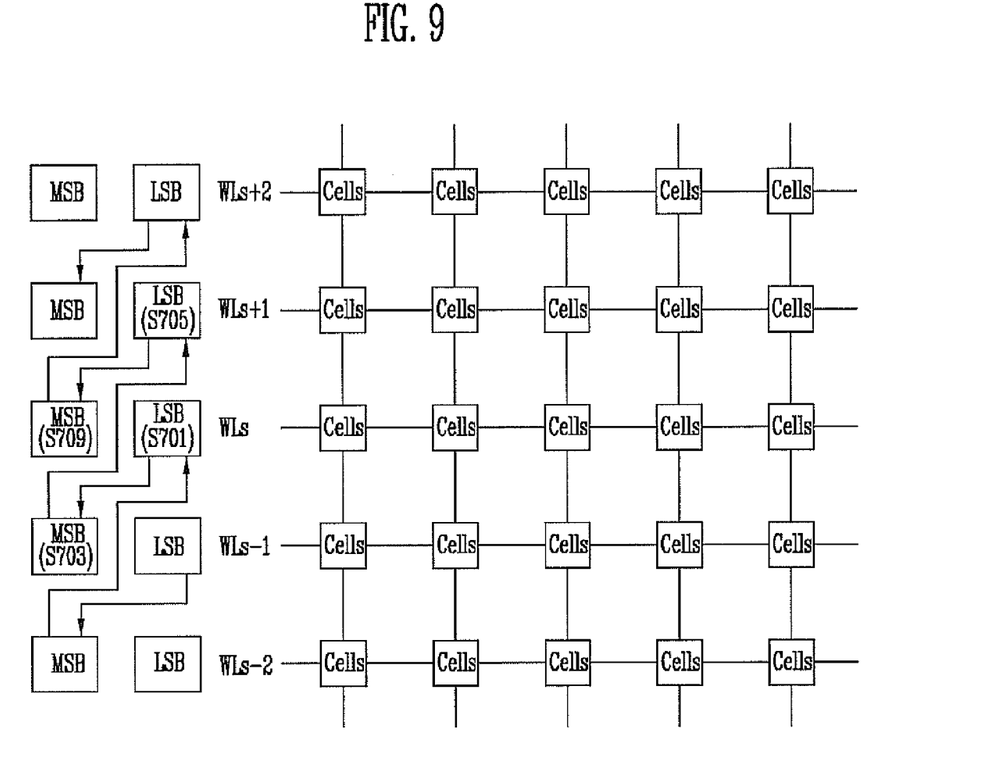
FIG. 9 is a diagram illustrating the sequence of a program operation in the operating method of the semiconductor memory device according to another exemplary embodiment of the present invention.

FIG. 8 is a flowchart illustrating the operating method of the semiconductor memory device according to another exemplary embodiment of the present invention. FIG. 9 is a diagram illustrating the sequence of a program operation in the operating method of the semiconductor memory device according to another exemplary embodiment of the present invention. A word line WLs is described to be selected in FIG. 9.

Referring to FIGS. 2, 6, 8 and 9, at step S801, a first LSB program loop is performed for memory cells coupled to the word line WLs. In order to perform the first LSB program loop, LSB data to be stored in the memory cells coupled to the word line WLs is inputted to the operation circuit (particularly, the page buffer group 250) that performs the first LSB program loop.

Next, when the operation circuit performs the first LSB program loop, the threshold voltages of some of the memory cells coupled to the word line WLs become higher than 0 V depending on the LSB data stored in the memory cells of the word line WLs. As a result the threshold voltages of the memory cells are divided into two distributions. For example, the threshold voltages of memory cells in which data '1' data is stored as the LSB data may not be shifted, but the threshold voltages of memory cells in which data '0' data is stored as the LSB data may become higher than 0 V.

Furthermore, as described with reference to FIG. 6B, in the first LSB program loop, the threshold voltages of over-erased memory cells having threshold voltages lower than the over-erase reference voltage Vpv0 of a negative potential, from among the memory cells of an erase state, are raised higher than the over-erase reference voltage Vpv0. That is, in order to raise the threshold voltages of the over-erased memory cells so that they are higher than the over-erase reference voltage Vpv0 of a negative potential during the first LSB program loop of the word line WLs, the first LSB program loop S801 includes an LSB program operation S801-1, a first program verification operation (S801-2 and S801-3) for checking whether there is a memory cell having a threshold voltage lower than 0 V or an LSB verification voltage higher than 0 V, and a second program verification operation (S801-4 and S804-5) for checking whether there is an over-erased memory cell having a threshold voltage lower than the over-erase reference voltage Vpv0.

The first LSB program loop S801 may be performed like the second LSB program loop S601 of FIG. 5 except that the first LSB program loop S801 is simultaneously performed for all the memory cells coupled to the word line WLs without classifying the memory cells into an even page and an odd page.

Accordingly, a distribution of the threshold voltages of the memory cells of an erase state is narrowed, and the lowest level of the threshold voltages becomes higher than the over-erase reference voltage Vpv0. As a result, in a subsequent MSB program loop, an increment of the threshold voltages of memory cells may be reduced, and thus an interference phenomenon occurring in memory cells coupled to word lines (particularly, WLs+1) adjacent to the word line WLs may be reduced. A method of comparing the threshold voltages of the over-erased memory cells with the over-erase reference voltage Vpv0 of a negative potential may be performed like the method described with reference to FIG. 7.

For example, the first LSB program loop is performed so that the threshold voltages of all the over-erased memory cells become higher than the over-erase reference voltage Vpv0. In some embodiments, however, the first LSB program loop may be performed such that the threshold voltage of an over-erased memory cell having a threshold voltage rise to one (preferably, the first program verification voltage Vpv1) of the first to third program verification voltages Vpv1, Vpv1, and Vpv3 in a second MSB program loop to be subsequently performed, from among over-erased memory cells, selectively becomes higher than a target voltage (i.e., the over-erase reference voltage Vpv0).

In this case, as described with reference to FIG. 6D, prior to the first LSB program loop, not only the LSB data, but also MSB data are to be inputted to the operation circuit (particularly, the page buffer group 250). When the MSB data is inputted, the page buffer group 250 may control the voltage of a bit line coupled to the selected over-erased memory cells the threshold voltage of which are raised from an erase level to a program level in the MSB program loop. If the threshold voltages of the selected over-erased memory cells are raised, the threshold voltages of the memory cells coupled to the word line WLs are classified into the distribution A, B, and C as shown in FIG. 6D, after the first LSB program loop is finished.

At step S803, a first MSB program loop is performed for memory cells coupled to a word line WLs-1 adjacent to the word line WLs on one side. The word line WLs−1 is adjacent to the word line WLs in the direction of the source select line SSL (see FIG. 3), and the memory cells coupled to the word line WLs-1 are memory cells on which the LSB program loop has been finished.

At step S805, a second LSB program loop is performed for memory cells coupled to the word line WLs+1 adjacent to the word line WLs on the other side. The word line WLs+1 is adjacent to the word line WLs in the direction of the drain select line SSL (see FIG. 3).

Like in the first LSB program loop described at step S801, the second LSB program loop is performed so that the threshold voltages of over-erased memory cells, from among the memory cells coupled to the word line WLs+1, become higher than the over-erase reference voltage Vpv0.

At step S807, a second MSB program loop is performed for the memory cells coupled to the word line WLs. Prior to the second MSB program loop, MSB data is inputted to the operation circuit (particularly, the page buffer group 250) that performs the second MSB program loop. If the MSB data, together with the LSB data, has been inputted prior to the first LSB program loop, the MSB data does not need to be inputted again.

The threshold voltages of the memory cells coupled to the word line WLs are classified into four distributions depending on the MSB data stored in the memory cells coupled to the word line WLs owing to the second MSB program loop. Thus, all the LSB data and the MSB data are stored in the memory cells coupled to the word line WLs.

Here, an increment of the threshold voltages of memory cells programmed with the first program verification voltage Vpv1 is reduced because the second MSB program loop is performed in the state that the threshold voltages of the memory cells have been raised higher than the over-erase reference voltage Vpv0 of a negative potential in the first LSB program loop. As a result, an interference phenomenon occurring in the memory cells of the word line WLs−1 on which the MSB program loop has been performed is reduced during the second MSB program loop. As a result a shift in the threshold voltages of the memory cells coupled to the word line WLs−1 during the second MSB program loop is minimized.

The LSB program loop and the MSB program loop for the memory cells coupled to all the word lines are performed in order of an arrow.

In accordance with the present invention, an interference phenomenon occurring in adjacent memory cells in a program operation is minimized. Accordingly, a shift in the threshold voltages of memory cells due to the interference phenomenon may be suppressed, and reliability of an operation may be improved.

Furthermore, reliability of an operation may be improved without an increase of the time taken for a program operation.

What is claimed is:

1. An operating method of a semiconductor memory device, comprising:
    performing a first Least Significant Bit (LSB) program loop for storing first LSB data in first memory cells of a selected word line;
    performing a second LSB program loop for storing second LSB data in second memory cells of the selected word line and for raising threshold voltages of over-erased memory cells lower than an over-erase reference voltage of a negative potential, among the second memory cells, to be higher than the over-erase reference voltage;
    performing a first Most Significant Bit (MSB) program loop for storing first MSB data in the first memory cells; and
    performing a second MSB program loop for storing second MSB data in the second memory cells.

2. The operating method of claim 1, wherein threshold voltages of the first and second memory cells are raised to be higher than LSB and MSB verification voltages, respectively, depending on the LSB and MSB data stored in the first and second memory cells.

3. The operating method of claim 1, wherein the performing of the second LSB program loop comprises:
    performing an LSB program operation for raising threshold voltages of memory cells, selected from the second memory cells, to be higher than an LSB verification voltage and for raising the threshold voltages of the over-erased memory cells to be higher than the over-erase reference voltage;
    performing a first program verification operation for checking whether the threshold voltages of the selected memory cells are higher than the LSB verification voltage; and
    performing a second program verification operation for checking whether the threshold voltages of the over-erased memory cells are higher than the over-erase reference voltage.

4. The operating method of claim 3, wherein in the performing of the second program verification operation:
    a positive voltage corresponding to an absolute value of the over-erase reference voltage is supplied to a bulk of the over-erased memory cells; and
    voltages higher than voltages supplied to the selected memory cells in the first program verification operation by the absolute value are supplied to the over-erased memory cells.

5. The operating method of claim 1, wherein in the performing of the second LSB program loop, the threshold voltages of the over-erased memory cells having the threshold voltages raised by the second MSB program loop are raised to be higher than the over-erase reference voltage.

6. The operating method of claim 5, further comprising inputting the second LSB data and the second MSB data for the second LSB program loop, before the performing of the second LSB program loop.

7. An operating method of a semiconductor memory device, comprising:
    performing a second Least Significant Bit (LSB) program loop for storing second LSB data in memory cells coupled to a second word line of a plurality of word lines and for raising threshold voltages of over-erased memory cells lower than an over-erase reference voltage of a negative potential, among the memory cells coupled to the second word line, to be higher than the over-erase reference voltage;
    performing a first Most Significant Bit (MSB) program loop for storing first MSB data in memory cells coupled to a first word line adjacent to the second word line on one side, among the plurality of word lines;
    performing a third LSB program loop for storing third LSB data in memory cells coupled to a third word line adjacent to the second word line on the other side; and
    performing a second MSB program loop for storing second MSB data in the memory cells coupled to the second word line.

8. The operating method of claim 7, threshold voltages of selected memory cells, among the memory cells coupled to the second word line, are raised to be higher than an LSB verification voltage in response to the second LSB data.

9. The operating method of claim 8, wherein the performing of the second LSB program loop comprises:
    performing an LSB program operation for raising the threshold voltages of the selected memory cells to be higher than the LSB verification voltage and for raising the threshold voltages of the over-erased memory cells to be higher than the over-erase reference voltage;
    performing a first program verification operation for checking whether the threshold voltages of the selected memory cells are higher than the LSB verification voltage; and
    performing a second program verification operation for checking whether the threshold voltages of the over-erased memory cells are higher than the over-erase reference voltage.

10. The operating method of claim 9, wherein in the performing of the second program verification operation:
    a positive voltage corresponding to an absolute value of the over-erase reference voltage is supplied to a bulk of the over-erased memory cells; and
    voltages higher than voltages supplied to the selected memory cells in the first program verification operation by the absolute value are supplied to the over-erased memory cells.

11. The operating method of claim 7, wherein in the performing of the second LSB program loop, the threshold voltages of the over-erased memory cells having the threshold voltages raised by the second MSB program loop are raised to be higher than the over-erase reference voltage.

12. The operating method of claim 11, further comprising inputting the second LSB data and MSB data for the second LSB program loop, before the performing of the second LSB program loop.

13. A semiconductor memory device, comprising:
a memory block comprising memory cells coupled to word lines;
an operation circuit configured to perform a first Least Significant Bit (LSB) program loop for memory cells included in an even page of a word line, selected from the word lines, a second LSB program loop for memory cells included in an odd page of the selected word line, a first Most Significant Bit (MSB) program loop for the memory cells of the even page, and a second MSB program loop for the memory cells of the odd page; and
a control circuit configured to control the operation circuit to detect over-erased memory cells having threshold voltages lower than an over-erase reference voltage of a negative potential, among the memory cells of the odd page, and raise the threshold voltages to be higher than the over-erase reference voltage while storing LSB data in the memory cells of the odd page in the second LSB program loop.

14. The semiconductor memory device of claim 13, wherein in the second LSB program loop, the operation circuit performs an LSB program operation for raising threshold voltages of memory cells, selected from the memory cells of the odd page, to be higher than an LSB verification voltage and for raising the threshold voltages of the over-erased memory cells to be higher than the over-erase reference voltage, performs a first program verification operation for checking whether the threshold voltages of the selected memory cells are higher than the LSB verification voltage, and performs a second program verification operation for checking whether the threshold voltages of the over-erased memory cells are higher than the over-erase reference voltage.

15. The semiconductor memory device of claim 14, wherein in the second program verification operation, the operation circuit supplies a positive voltage, corresponding to an absolute value of the over-erase reference voltage, to a bulk of the over-erased memory cells and supplies voltages higher than voltages supplied to the selected memory cells in the first program verification operation by the absolute value, to the over-erased memory cells.

16. The semiconductor memory device of claim 13, wherein in the second LSB program loop, the operation circuit detects the over-erased memory cells having the threshold voltages raised to a lowest program level of a plurality of program levels by the second MSB program loop in response to the LSB data and an MSB data and raises the threshold voltages of the detected over-erased memory cells to be higher than the over-erase reference voltage.

17. A semiconductor memory device, comprising:
a memory block comprising memory cells coupled to word lines;
an operation circuit configured to perform a second Least Significant Bit (LSB) program loop for memory cells coupled to a second word line of the word lines, a first Most Significant Bit (MSB) program loop for memory cells coupled to a first word line adjacent to the second word line on one side, a third LSB program loop for memory cells coupled to a third word line adjacent to the second word line on the other side, and a second MSB program loop for the memory cells coupled to the second word line; and
a control circuit configured to control the operation circuit to detect over-erased memory cells having threshold voltages lower than an over-erase reference voltage of a negative potential, among the memory cells coupled to the second word line, and raise the threshold voltages to be higher than the over-erase reference voltage while storing LSB data in the memory cells coupled to the second word line.

18. The semiconductor memory device of claim 17, wherein in the second LSB program loop, the operation circuit performs an LSB program operation for raising threshold voltages of memory cell, selected from the memory cells coupled to the second word line, to be higher than an LSB verification voltage and for raising the threshold voltages of the over-erased memory cells to be higher than the over-erase reference voltage, a first program verification operation for checking whether the threshold voltages of the selected memory cells are higher than the LSB verification voltage, and a second program verification operation for checking whether the threshold voltages of the over-erased memory cells are higher than the over-erase reference voltage.

19. The semiconductor memory device of claim 18, wherein in the second program verification operation, the operation circuit supplies a positive voltage, corresponding to an absolute value of the over-erase reference voltage, to a bulk of the over-erased memory cells and supplies voltages higher than voltages supplied to the selected memory cells in the first program verification operation by the absolute value, to the over-erased memory cells.

20. The semiconductor memory device of claim 17, wherein in the second LSB program loop, the operation circuit detecting the over-erased memory cells having the threshold voltages raised to a lowest program level of a plurality of program levels by the second MSB program loop and raise the threshold voltages of the detected over-erased memory cells to be higher than the over-erase reference voltage.

* * * * *